United States Patent
Ohta et al.

(10) Patent No.: US 7,550,757 B2
(45) Date of Patent: Jun. 23, 2009

(54) SEMICONDUCTOR LASER AND METHOD FOR MANUFACTURING SEMICONDUCTOR LASER

(75) Inventors: Hiroaki Ohta, Kyoto (JP); Shinichi Kohda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 275 days.

(21) Appl. No.: 11/560,972

(22) Filed: Nov. 17, 2006

(65) Prior Publication Data
US 2007/0114513 A1    May 24, 2007

(30) Foreign Application Priority Data
Nov. 18, 2005    (JP) .............................. 2005-334567

(51) Int. Cl.
*H01L 31/00*    (2006.01)
(52) U.S. Cl. .............................. 257/13; 257/37; 257/21; 257/59; 257/79; 257/72; 257/103; 257/99
(58) Field of Classification Search .................. 257/21, 257/59, 79, 72, 103, 99, 13, 37
See application file for complete search history.

(56) References Cited

U.S. PATENT DOCUMENTS

| | | | |
|---|---|---|---|
| 5,563,422 A | 10/1996 | Nakamura et al. | |
| 5,652,434 A | 7/1997 | Nakamura et al. | |
| 5,767,581 A | 6/1998 | Nakamura et al. | |
| 5,777,350 A * | 7/1998 | Nakamura et al. | ............ 257/96 |
| 5,877,558 A | 3/1999 | Nakamura et al. | |
| 6,093,965 A | 7/2000 | Nakamura et al. | |
| 6,172,382 B1 | 1/2001 | Nagahama et al. | |
| 6,204,512 B1 | 3/2001 | Nakamura et al. | |
| 6,329,716 B1 | 12/2001 | Nido et al. | |
| 6,423,562 B1 | 7/2002 | Nido et al. | |
| 6,507,041 B2 | 1/2003 | Nakamura et al. | |
| 6,580,099 B2 * | 6/2003 | Nakamura et al. | .......... 257/103 |
| 6,610,995 B2 | 8/2003 | Nakamura et al. | |
| 6,649,943 B2 * | 11/2003 | Shibata et al. | ............. 257/189 |
| 6,677,619 B1 | 1/2004 | Nagahama et al. | |
| 6,849,864 B2 | 2/2005 | Nagahama et al. | |
| 6,900,465 B2 * | 5/2005 | Nakamura et al. | ............ 257/79 |
| 6,996,150 B1 | 2/2006 | Shakuda | |
| 6,998,690 B2 | 2/2006 | Nakamura et al. | |
| 2001/0030318 A1 * | 10/2001 | Nakamura et al. | ............ 257/13 |
| 2002/0167019 A1 * | 11/2002 | Nakamura et al. | .......... 257/103 |
| 2006/0243988 A1 * | 11/2006 | Narukawa et al. | ............. 257/79 |

FOREIGN PATENT DOCUMENTS

| | | |
|---|---|---|
| JP | 07-221103 A | 8/1995 |
| JP | 11-177175 A | 7/1999 |

* cited by examiner

*Primary Examiner*—Phuc T Dang
*Assistant Examiner*—Thanh Y Tran
(74) *Attorney, Agent, or Firm*—Keating & Bennett, LLP

(57) ABSTRACT

A back-surface-electrode type semiconductor laser of GaN-based compound has low electric resistance and high light emitting efficiency, and includes negative electrodes made of Al having a contact surface that contacts with the n-type GaN substrate. The back-surface-electrode type semiconductor laser has GaN-based compound layers laminated on an n-type GaN substrate with an area of reversal of polarity with low electric resistance and a negative electrode is disposed on the side opposite to the side of GaN-based compound layer of the GaN substrate so as to come in contact with the area of reversal of polarity.

11 Claims, 8 Drawing Sheets

SEMICONDUCTOR LASER AND METHOD FOR MANUFACTURING SEMICONDUCTOR LASER

BACKGROUND OF THE INVENTION

1. Field of the Invention

The present invention relates to semiconductor lasers which are formed by laminating a plurality of semiconductor layers between a negative electrode and a positive electrode, and also relates to methods for manufacturing such a semiconductor laser.

2. Description of the Art

A semiconductor light-emitting element has a double heterojunction structure as a basic structure, which includes a semiconductor layer called an active layer which generates light by recombination of carriers and semiconductor layers called clad layers which sandwich the active layer from both sides and supply carriers to the active layer. Because the wavelength of light emitted is determined by a band gap of the active layer, a material and configuration of the active layer from which the light with a desired wavelength could be obtained are chosen. The clad layer is designed to have a wider band gap than the active layer in order to easily supply carriers to the active layer, and impurities that control the carrier polarity are added. Consequently, the negative and the positive carriers are recombined at the active layer and generate light.

Because Group III nitride-based compounds whose compositional formula is expressed as $Al_xGa_yIn_{1-x-y}N$ ($0 \leq x \leq 1$, $0 \leq y \leq 1$, $0 \leq x+y \leq 1$) (hereinafter referred to as "GaN-based compounds") are able to adjust the band gap by varying the composition, GaN-based compounds are frequently used as a semiconductor laser material (for example, see Japanese Patent Laid-open Publication No. H11-177175, hereinafter referred to as Patent Literature 1).

In order to allow a semiconductor laser to emit light, electrodes which are connected to external devices such as a power supply, etc. are required. Because rectifiability is generated when the electrode comes in contact with the semiconductor, efficiency as a semiconductor laser is impaired, and therefore, for the electrode, a material which can form an ohmic junction with a semiconductor is required. For example, as an electrode material that can form an ohmic junction with n type GaN (gallium nitride) with a negative electrode, Ti/Al (multilayer film with Ti and Al laminated successively from the side that comes in contact with the n type GaN layer) or Ti—Al (Ti and Al alloy) are known (for example, see Japanese Patent Laid-open Publication No. H7-221103, hereinafter referred to as Patent Literature 2).

In the following description, the "lamination direction of the semiconductor layer" is defined as the "vertical direction" and the "direction vertical to the lamination direction of the semiconductor layer" is defined as the "horizontal direction" of the semiconductor laser.

Back-surface-electrode type semiconductor lasers which are one of the semiconductor laser structures that have a substrate disposed between the negative electrode and the positive electrode and a plurality of semiconductor layers arranged on the substrate, and in general, the electrode on the substrate side is designated as the negative electrode. Because electrons injected from the negative electrode in the back-surface-electrode type semiconductor lasers must pass the substrate in the thickness direction of the substrate, materials with conductivity or n-type semiconductors are used. However, n-type GaN used as substrates for GaN-based compound back-surface-electrode type semiconductor lasers has a thickness of about 100 μm because it is the base of the semiconductor laser, and causes a high electric resistance to the semiconductor lasers.

Furthermore, in order to achieve ohmic-junction between n-type GaN and Ti/Al or Ti—Al as described in Patent Literature 2, sintering (heat treatment) at 400° C. or higher is required. The back-surface-electrode type semiconductor lasers, in general, form negative electrodes after forming positive electrodes. Consequently, when Ti/Al or Ti—Al is used for the negative electrode of back-surface-electrode type semiconductor lasers of GaN-based compounds, damage is caused to occur in the positive electrodes by the sintering. That is, with the back-surface-electrode type semiconductor lasers of GaN-based compounds, sintering is unable to be carried out at a sufficient temperature and it has been difficult to ohmic-junction the conventional negative electrodes which contain Ti with n-type GaN substrates.

Consequently, back-surface-electrode type semiconductor lasers of GaN-based compounds have problems of high electric resistance and low light-emitting efficiency.

SUMMARY OF THE INVENTION

In order to solve the aforementioned problems, preferred embodiments of the present invention provide back-surface-electrode type semiconductor lasers of GaN-based compounds with low electric resistance and high light emitting efficiency and methods for manufacturing the same.

A back-surface-electrode type semiconductor laser of GaN-based compounds according to a preferred embodiment of the present invention preferably includes negative electrodes whose contact surface that contacts with the n-type GaN substrate are made of Al.

More specifically, according to one preferred embodiment of the present invention, a semiconductor laser includes a GaN substrate of Group III nitride based compounds expressed by a compositional formula of GaN, a semiconductor laminated body on which a plurality of layers of Group III nitride based compounds expressed by a compositional formula of $Al_xGa_yIn_{1-x-y}N$ ($0 \leq x \leq 1$, $0 \leq y \leq 1$, $0 \leq x+y \leq 1$) are laminated in the thickness direction of the GaN substrate, a positive electrode disposed on the side opposite to the GaN substrate side of the semiconductor laminated body, and a negative electrode which has an Al layer in contact with the opposite side of the semiconductor laminated body side of the GaN substrate.

Various materials were tried for electrodes formed on n-type GaN substrates and ohmic junction was confirmed, and it was discovered that Al can solve the above-described problems. That is, Al is the material which can form an ohmic junction with n-type GaN substrates without sintering.

Consequently, preferred embodiments of the present invention provide back-surface-electrode type semiconductor lasers of GaN-based compounds with low electric resistance and high light-emitting efficiency because the negative electrode forms an ohmic junction with the n-type GaN substrate.

It is preferable to clean the contact surface that contact with the Al layer of the n-type GaN substrate with a cleaning liquid before the Al layer of the negative electrode is brought in contact with the n-type GaN substrate.

According to another preferred embodiment of the present invention, a method for manufacturing semiconductor lasers having a semiconductor laminated body includes forming a semiconductor laminated body by laminating a plurality of Group III nitride based compound layers expressed by the compositional formula of $Al_xGa_yIn_{1-x-y}N$ ($0 \leq x \leq 1$, $0 \leq y \leq 1$, $0 \leq x+y \leq 1$) in the thickness direction of the GaN substrate on the GaN substrate of Group III nitride based compounds expressed by a compositional formula of GaN, forming a positive electrode on the side opposite to the GaN substrate side of the semiconductor laminated body, cleaning the side opposite to the semiconductor laminated body side of the GaN substrate, and forming a negative electrode which has an Al layer in contact with the side opposite to the semiconductor laminated body side of the GaN substrate.

As described above, Al forms ohmic junction with the n-type GaN substrate without sintering but the negative electrode may be peeled off due to weak adhesion. Therefore, when various methods were tried, it was discovered that adhesion between Al and n-type GaN substrate could be improved by cleaning the surface of the n-type GaN substrate using a predetermined cleaning liquid before forming the negative electrode.

Consequently, preferred embodiments of the present invention allow an ohmic junction to be definitely formed between the negative electrode and the n-type GaN substrate by performing the cleaning process before the negative electrode forming process and also provide a method for manufacturing a back-surface-electrode type GaN-based compounds with low electric resistance and high light-emitting efficiency.

In order to achieve the advantages described above, the back-surface electrode type semiconductor laser of GaN-based compound according to preferred embodiments of the present invention preferably uses an n-type GaN substrate which has an area of reversal of polarity with low electric resistance and has a negative electrode formed in contact with the area of reversal of polarity.

According to preferred embodiments of the present invention, a semiconductor laser which is a Group III nitride based compound expressed by the compositional formula of GaN includes a GaN substrate which has an area of reversal of polarity whose dislocation density is higher than that of other areas, a semiconductor laminated body in which a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) are laminated on the GaN substrate in the thickness direction of the GaN substrate, a positive electrode formed on the side opposite to the GaN substrate side of the semiconductor laminated body, a negative electrode which has a metal layer in contact with the side opposite to the semiconductor laminated body side of the GaN substrate, wherein the area of reversal of polarity of the GaN substrate extends in the direction from the negative electrode side of the GaN substrate to the semiconductor laminated body side, and the metal layer of the negative electrode comes in contact with the area of reversal of polarity at the interface between the GaN substrate and the negative electrode.

Furthermore, the GaN substrate has the area of reversal of polarity. The area of reversal of polarity is an area with the density of crystal dislocation higher than that of other areas of the GaN substrate, and extends vertically in the direction from the negative electrode side of the GaN substrate to the semiconductor laminated body side. Because the area of reversal of polarity provides a low electric resistance, electrons from the negative electrode can reach the semiconductor laminated body via the area of reversal of polarity by allowing the negative electrode to come into contact with the area of reversal of polarity.

Consequently, preferred embodiments of the present invention provide back-surface-electrode type semiconductor lasers of GaN-based compounds with low electric resistance and high light-emitting efficiency by equipping the n-type GaN substrate with the area of reversal of polarity.

By using a metal layer having a work function smaller than that of n-type GaN for the aforementioned metal layer, the negative electrode and the GaN substrate create an ohmic junction.

In preferred embodiments of the present invention, it is desirable that the element of the metal layer of the negative electrode is Al.

As described above, Al is the material which forms an ohmic junction with the n-type GaN substrate without sintering.

Consequently, because preferred embodiments of the present invention have an ohmic junction formed between the negative electrode and the n-type GaN substrate and is equipped with the n-type GaN substrate with the area of reversal of polarity, preferred embodiments of the present invention can provide back-surface-electrode type semiconductor lasers of GaN-based compounds with a still lower electric resistance and higher light-emitting efficiency.

In order to enable the negative electrode and the n-type GaN substrate to form an ohmic junction, the contact surface must be cleaned with a cleaning liquid before bringing the n-type GaN substrate in contact with the metal layer.

According to another preferred embodiment of the present invention, a method of manufacturing semiconductor lasers includes forming a GaN substrate with an area of reversal of polarity whose dislocation density is higher than that of other areas and which extends from a mask of a substrate forming board in the growing direction of Group III nitride based compounds expressed by the compositional formula of GaN by allowing Group III nitride based compounds expressed by the compositional formula of GaN to grow on one of the surfaces of the substrate forming board with the mask on one surface in the thickness direction, forming a semiconductor laminated body by laminating a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) in the laminating direction of the GaN substrate in such a manner that the laminated body comes in contact with the area of reversal of polarity which appears on the side opposite to the substrate forming board side of the GaN substrate, forming a positive electrode on the side opposite to the GaN substrate side of the semiconductor laminated body, forming a GaN substrate bottom surface by removing the substrate forming board until the area of reversal of polarity of the GaN substrate is exposed from the side opposite to the GaN substrate side of the substrate forming board at least in the GaN substrate direction, cleaning the GaN substrate bottom surface formed in the substrate forming board removal process with a cleaning liquid, and forming a negative electrode by laminating metal layers in such a manner as to come in contact with the area of reversal of polarity exposed on the GaN substrate bottom after the cleaning process.

In addition, according to another preferred embodiment of the present invention, a method of manufacturing semiconductor lasers includes forming a GaN substrate with an area of reversal of polarity whose dislocation density is higher than that of other areas and which extends from a mask of a substrate forming board in the growing direction of Group III nitride based compounds expressed by the compositional formula of GaN by allowing Group III nitride based compounds expressed by the compositional formula of GaN to grow on one of the surfaces of the substrate forming board with the mask on one surface in the thickness direction, removing the substrate forming board until the area of reversal of polarity of the GaN substrate is exposed from the side opposite to the GaN substrate side of the substrate forming board at least in the GaN substrate direction, forming a semiconductor laminated body by laminating a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) in the thickness direction of the GaN substrate in such a manner that the laminated body comes in contact with the area of reversal of polarity of either one of the surfaces located in the thickness direction of the GaN substrate, forming a positive electrode on the side opposite to the GaN substrate side of the semiconductor laminated body, cleaning the GaN substrate bottom surface opposite to the semiconductor laminated body side of the GaN substrate with a cleaning liquid, and forming a negative electrode by laminating metal layers in such a manner as to come in contact with the area of reversal of polarity exposed on the GaN substrate bottom after the cleaning process.

As described above, the metal forms an ohmic junction with an n-type GaN substrate without sintering but provides weak adhesion and the negative electrode may be peeled of. Therefore, various methods were tried, and it was found that cleaning the surface of the n-type GaN substrate with a predetermined cleaning liquid before forming the negative electrode improves adhesion between the metal and the n-type GaN substrate.

In addition, as described above, the area of reversal of polarity of the GaN substrate can lower the electric resistance of the semiconductor laser. By using the substrate forming board with the mask in the substrate forming process, the area of reversal of polarity can be positively formed at a desired position of the GaN substrate.

Consequently, preferred embodiments of the present invention can form an n-type GaN substrate with the area of reversal of polarity in the substrate forming process and by including the cleaning process before the negative electrode forming process, an ohmic junction can be definitely created between the negative electrode and the n-type GaN substrate, and provide a method of manufacturing back-surface-electrode type semiconductor lasers of GaN-based compounds with low electric resistance and high light-emitting efficiency.

In preferred embodiments of the present invention, it is desirable to form the negative electrode by laminating Al as the metal layer which comes in contact with the GaN substrate bottom surface in the negative electrode forming process.

As described above, Al is the material which forms an ohmic junction with an n-type GaN substrate without sintering. Consequently, in the negative electrode forming process, the Al layer may be formed on the side that comes in contact with the n-type GaN substrate of the negative electrode.

Consequently, preferred embodiments of the present invention can form an n-type GaN substrate having the area of reversal of polarity in the substrate forming process, can allow the negative electrode and the n-type GaN substrate to definitely form an ohmic junction by performing the cleaning process before the negative electrode forming process, and can provide a method of manufacturing a back-surface-electrode type semiconductor lasers of GaN-based compounds with low electric resistance and high light-emitting efficiency.

As described above, preferred embodiments of the present invention provide back-surface-electrode type semiconductor lasers of GaN-based compounds with low electric resistance and high light-emitting efficiency and a method of manufacturing the same.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Referring now to drawings, preferred embodiments of the present invention will be described in detail hereinafter. The present invention shall not be restricted to the preferred embodiments shown below.

First Preferred Embodiment

The present preferred embodiment is a semiconductor laser having a GaN substrate of Group III nitride-based compounds expressed by the compositional formula of GaN, a semiconductor laminated body on which a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) are laminated in the thickness direction of the GaN substrate, a positive electrode disposed on the side opposite to the GaN substrate side of the semiconductor laminated body, and a negative electrode which has an Al layer in contact with the opposite side of the semiconductor laminated body side of the GaN substrate.

Figure 1:
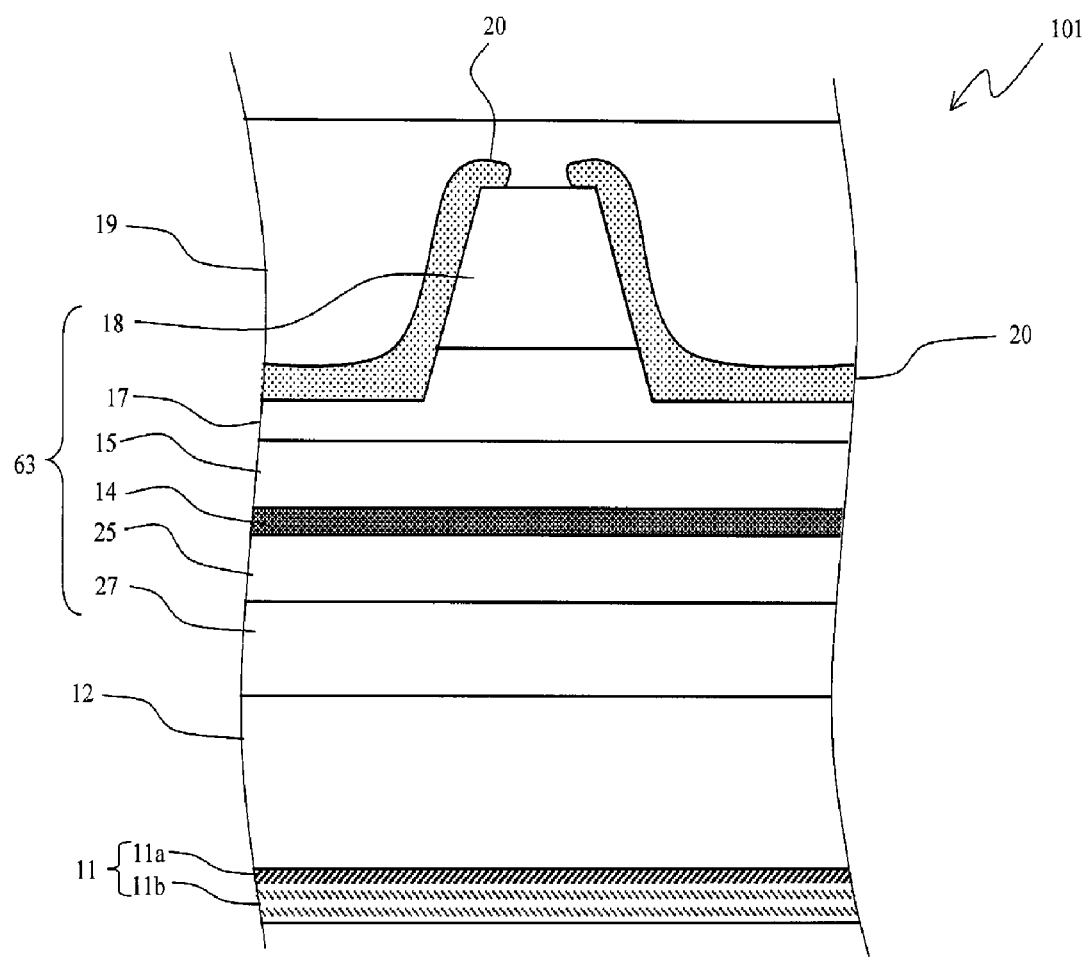
FIG. 1 is a conceptual block diagram of a cross-section of a semiconductor laser according to a preferred embodiment of the present invention.

FIG. 1 is a conceptual diagram of a cross section of a semiconductor laser 101 according to the present preferred embodiment. The semiconductor laser 101 has a negative electrode 11, a GaN substrate 12, a semiconductor laminated body 63, a positive electrode 19, and an insulation film 20. The semiconductor laminated body 63 is provided with an n-type clad layer 27, an n-side light guide layer 25, an active layer 14, a p-side light guide layer 15, a p-type clad layer 17, and p-type contact layer 18. The semiconductor laser 101 is preferably a back-surface-electrode type semiconductor laser in which the positive electrode 19 and the negative electrode 11 are arranged so as to sandwich the GaN substrate 12 and the semiconductor laminated body 63.

The semiconductor laser 101 has the semiconductor laminated body 63 laminated on the GaN substrate 12, and with respect to the active layer 14, the p-type clad layer 17 and p-type contact layer 18 on the side of the positive electrode 19 are preferably p-type. On the other hand, with respect to the active layer 14, the n-type clad layer 27 on the side of the GaN substrate 12 is an n-type.

In addition, the semiconductor laser 101 has a mesa that includes a portion from the p-type contact layer 18 to a part of the p-type clad layer 17 in the vertical direction. The mesa may include a portion from the p-type contact layer 18 to the p-side light guide layer 15.

The GaN substrate 12 is a bulk-form n-type GaN crystal. The thickness of the GaN substrate 12 in the vertical direction can be exemplified to be from about 80 μm or more to about 200 μm or less. The GaN substrate 12 serves as a base that physically supports the semiconductor laminated body 63.

The negative electrode 11 and the positive electrode 19 are arranged to apply a voltage to the semiconductor laser 101. In the event that rectifiability is generated when the electrode comes in contact with the semiconductor, the efficiency of the semiconductor laser is impaired. Therefore, it is desirable that the positive electrode 19 should be a metal which can form an ohmic junction with a p-type GaN-based compound and the negative electrode 11 should be a metal which can form an ohmic junction with the GaN substrate 12. For example, examples of metal which can create an ohmic junction with a p-type GaN based compounds include Ni, Pd, and Pt. In addition, examples of metal which can form an ohmic junction with an n-type GaN substrate include Al, Ti, and Zr.

Furthermore, the negative electrode 11 and the positive electrode 19 are desirably metals with small contact resistance with wiring of an external power supply and other devices. Consequently, the negative electrode 11 and the positive electrode 19 may be configured with a plurality of layers of materials which come in contact with the semiconductor.

Examples of a configuration of the positive electrode 19 include Ni/Au, Pd/Au, Pt/Au, and Pd/Pt/Au. In all configurations, the front metal of "/" is on the side of p-type contact layer 18. On the other hand, examples of the configuration of the negative electrode 11 include Ti/Al, Zr/Al, and Al/Au. In all configurations, the front metal of "/" is on the GaN substrate 12 side. In particular, since the n-type GaN and Al can create an ohmic junction without sintering, in the event that the configuration of the negative electrode 11 is Al/Au, sintering which has been conventionally required can be eliminated.

The active layer 14 is a layer which emits light by recombination of electrons and positive holes. The band gap of the material adopted for the active layer 14 determines the wavelength of light to be emitted. The material adopted for the active layer 14 is preferably a direct transition semiconductor with high light-emitting efficiency. Because GaN-based compounds can produce a wide band gap by adjusting contents of Al and In, using GaN-based compounds for the active layer 14 can manufacture a semiconductor laser having a desired wavelength.

Furthermore, the active layer 14 can be made into a multi-quantum well structure (MQW) with the semiconductor thin film with a wider band gap used as a barrier layer and the semiconductor film with a narrower band gap used as a well layer by alternately arranging at least two kinds of semiconductor thin films with mutually different band gaps. Electrons concentrate on a specific energy condition by using the MQW for the active layer 14 and light can be efficiently emitted with a small current. When the MQW is used, the wavelength of light to be emitted by the band gap of the well layer is decided.

The MQW can be exemplified by a combination of GaN-based compounds which have x=0 and y=d ($0.95 \leq d \leq 1$, preferably, $0.97 \leq d \leq 1$) in the aforementioned compositional formula as a barrier layer with GaN-based compounds which have x=0 and y=e ($0.80 \leq d \leq d$, preferably, $0.85 \leq e \leq 0.95$) in the aforementioned compositional formula as a well layer. In addition, the barrier layer of the MQW is exemplified by film thickness of about 5 nm or more to about 20 nm or less and the well layer of MQW by film thickness of about 1 nm or more to about 10 nm or less. Combinations of the barrier layer and the well layer which define the MQW are exemplified to be from 2 or more to 3 or less combinations.

In semiconductor lasers, a phenomenon called carrier overflow occurs, in which electrons receiving heat energy by heat generation associated with light emission cross over the barrier of a quantum well and move to the semiconductor layer on the p-type side and become ineffective carriers and degrade the light-emitting efficiency of semiconductor lasers. In the active layer 14, an electron barrier layer of GaN-based compounds that prevent carrier overflow in the active layer 14 may be arranged at the end of the MQW on the p-type side with respect to the MQW. Because the electron barrier layer has a wide band gap and high bottom level of the transmission band, even the electrons which obtained the heat energy are unable to pass the electron barrier layer and move to the semiconductor layer on the p-type side. The active layer 14 can reduce ineffective carriers by having the electron barrier layer, and the light-emitting efficiency of the semiconductor lasers can be increased. For example, the electron barrier layer is exemplified to be GaN-based compounds which are expressed by $0.1 \leq x \leq 0.3$ and y=1−x in the compositional formula. In addition, the film thickness of the electron barrier layer is exemplified to be from about 10 nm or more to about 30 nm or less.

The n-type clad layer 27 is a semiconductor layer of GaN-based compounds. The n-type clad layer 27 is exemplified by GaN-based compounds of the relation of $0.01 \leq x \leq 0.15$, preferably, $0.05 \leq x \leq 0.1$, and x+y=1 in the compositional formula. To the n-type clad layer 27, n-type impurities, for example, Si or O, are added to improve the carrier density and the mean n-type impurity concentration can be exemplified to be about $5 \times 10^{17}$ cm$^{-3}$ or more to about $1 \times 10^{19}$ cm$^{-3}$ or less. The film thickness of the n-type clad layer 27 is exemplified to be from about 30 nm or more to about 2000 nm or more.

The n-side light guide layer 25 is a semiconductor layer of GaN-based compounds. The band gap of the n-side light guide layer 25 is designed to have a composition that it achieves the band gap wider than the band gap of the active layer 14 and at the same time narrower than the band gap of the n-type clad layer 27. In the event that the active layer 14 is the MQW, the band gap of the n-side light guide layer 25 is designed to be wider than the band gap of the barrier layer which constitutes the MQW and narrower than the band gap of the n-type clad layer 27. Specifically, the n-side light guide layer 25 is exemplified by GaN compounds which have a relation of x=0 and y=1 in the compositional formula. The composition of the n-side light guide layer 25 may be GaN-based compounds which have x=0 and $0.95 \leq y \leq 1$.

To the n-side light guide layer 25, no impurity is added to prevent impurities from diffusing into the active layer 14 or in the event that impurities are added, the concentration shall be lower than the concentration of the n-type impurities added to the n-type clad layer 27. n-type impurities are exemplified by Si or O and the mean n-type impurity concentration is exemplified to be from about 0 cm$^{-3}$ or more to about $1 \times 10^{18}$ cm$^{-3}$ or less. The film thickness of the n-side guide layer 25 is exemplified to be about 20 nm or more to about 200 nm or less.

The p-type clad layer 17 is a semiconductor layer of GaN-based compounds. The p-type clad layer 17 is exemplified by the composition same as that of the n-type clad layer 27. To the p-type clad layer 17, p-type impurities, for example, Mg, are added to increase the carrier density. The mean p-type impurity concentration of the p-type clad layer 17 is exemplified to be about $5 \times 10^{18}$ cm$^{-3}$ or more to about $1 \times 10^{20}$ cm$^{-3}$ or less. The film thickness of the p-type clad layer 17 is exemplified to be about 100 nm or more to about 2000 nm or less.

The p-side light guide layer 15 is a semiconductor layer of GaN-based compounds of the composition same as the n-type light guide layer 25. To the p-side light guide layer 15, no impurity is added to prevent impurities from diffusing into the active layer 14 or in the event that impurities are added, the concentration shall be lower than the concentration of the n-type impurities added to the p-type clad layer 17. The p-type clad layer 17 is exemplified by Mg and the mean p-type impurity concentration is exemplified to be about 0 cm$^{-3}$ or more to about $1 \times 10^{19}$ cm$^{-3}$ or less. The film thickness of the p-side light guide layer 15 is exemplified to be about 20 nm or more to about 200 nm or less.

The p-type contact layer 18 is a semiconductor layer to create an ohmic junction with the positive electrode 19. For example, GaN compounds with film thickness from about 10 nm or more to about 100 nm or less can be exemplified. In the event that the p-type contact layer 18 is a GaN compound, Mg is exemplified as impurities to be added.

The insulation film 20 is a film made of material with high insulation capability such as ZrO$_2$ or SiO$_2$, etc. The insulation film 20 electrically separates the positive electrode 19 from each semiconductor layer.

The semiconductor laser 101 can be manufactured by a method of manufacturing semiconductor lasers including forming a semiconductor laminated body by laminating a plurality of Group III nitride based compound layers expressed by the compositional formula of Al$_x$Ga$_y$In$_{1-x-y}$N ($0 \leq x \leq 1$, $0 \leq y \leq 1$, $0 \leq x+y \leq 1$) in the thickness direction of the GaN substrate on the GaN substrate of Group III nitride based compounds expressed by the compositional formula of GaN, forming a positive electrode on the side opposite to the GaN substrate side of the semiconductor laminated body, cleaning the side opposite to the semiconductor laminated body side of the GaN substrate, and forming a negative electrode which has an Al layer in contact with the side opposite to the semiconductor laminated body side of the GaN substrate after the cleaning process.

Figure 2:
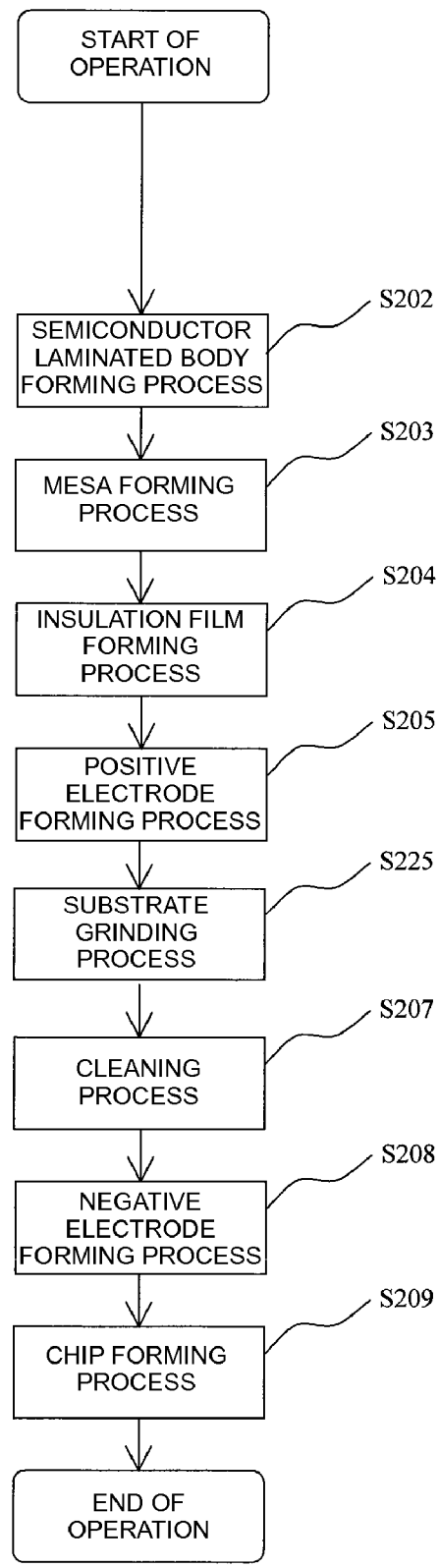
FIG. 2 is a process flow chart of a method of manufacturing semiconductor lasers according to a preferred embodiment of the present invention.

FIG. 2 is a process flow chart of a method of manufacturing semiconductor lasers to manufacture the semiconductor laser 101. The method of manufacturing semiconductor lasers of FIG. 2 includes a semiconductor laminated body forming process S202, a mesa forming process S203, an insulation film forming process S204, a positive electrode process S205, a substrate grinding process S255, a cleaning process S207, a negative electrode forming process S208, and a chip forming process S209. The substrate grinding process S255 may be omitted.

Each process of the method of manufacturing semiconductor lasers of FIG. 2 will be specifically described as follows. The description will be made by using reference characters used in FIG. 1 as needed.

Semiconductor Laminated Body Forming Process S202

The semiconductor laminated body forming process S202 is a process to form a semiconductor laminated body by laminating a plurality of Group III nitride-based compound layers expressed as Al$_x$Ga$_y$In$_{1-x-y}$N ($0 \leq x \leq 1$, $0 \leq y \leq 1$, $0 \leq x+y \leq 1$) on a GaN substrate of Group III nitride-based compounds, whose compositional formula is expressed as GaN.

On a wafer-form GaN substrate 12, the n type clad layer 27, the n-side light guide layer 25, the active layer 14, the p-side light guide layer 15, the p-type clad layer 17, and the p-type contact layer 18 are laminated successively in that order.

Each of the semiconductor layers of the semiconductor laminated body 63 is laminated by the use of a metalorganic chemical vapor deposition (hereinafter called the "MOCVD method"). The MOCVD method is a method to introduce material gases into a reactor furnace (chamber), thermally decompose and allow material gases to react on a substrate fixed in the chamber and maintained to about 600 degrees in Celsius to about 1100 degrees in Celsius, and epitaxially grow thin film. By controlling manufacturing parameters such as flowrate and concentration of material gases, reaction temperature and time, types of diluting gas, etc., semiconductor layers with varying compositions and film thicknesses can be easily laminated and manufactured.

In the case of GaN-based compounds, the MOCVD method uses vapors of Ga(CH$_3$)$_3$ (trimethylgallium, hereinafter called "TMG"), In(C$_2$H$_5$)$_3$ (triethylindium, hereinafter called "TMI"), and Al(CH$_3$)$_3$ (trimethylaluminum, hereinafter called "TMA") bubbled by carrier gas hydrogen or nitrogen as material gases as Group III based compound, and uses ammonia gas to produce nitride. The material gases are introduced into the chamber by carrier gas hydrogen or nitrogen.

In addition, for impurities, CP$_2$Mg cyclopentadienylmagnesium) can be introduced as a p-type dopant or SiH$_4$ (silane) as an n-type dopant into the chamber as vapor in the same manner.

The MOCVD method can grow GaN-based compounds of a desired composition by manufacturing parameters of the flowrate of mixed gas with CP$_2$Mg or SiH$_4$, TMG, TMI, TMA, and ammonia mixed at a predetermined mixture ratio as well as the substrate temperature, and the film thickness can be controlled by reaction time.

Consequently, on a wafer-form GaN substrate 12 fixed in the chamber, the n-type clad layer 27, the n-side light guide layer 25, the active layer 14, the p-side light guide layer 15, the p-type clad layer 17, and the p-type contact layer 18 can be laminated successively in that order to produce the semiconductor laminated body 63.

Mesa Forming Process S203

The mesa forming process S203 is a process of forming a plurality of and parallel stripe-form mesa on the surface opposite to the GaN substrate 12 side of the semiconductor laminated body 63.

First, on the top surface of the p-type contact layer 18, an etching mask layer is laminated. The etching mask layer is exemplified by an $SiO_2$ layer which is formed by sputtering or an $SiO_2$ layer which is formed by heating and solidifying or by ultraviolet-curing after spin-coating. After forming the etching mask layer, on the top surface of the etching mask layer, resist patterns are formed on the portion where a mesa is formed by lithography. That is, the resist pattern is formed in a plurality of stripes at desired intervals. For example, the resist pattern intervals may be about 100 μm or more and about 500 μm or less, the resist pattern line width may be about 1 μm or more and about 10 μm or less, preferably about 1 μm or more and about 2 μm or less. After forming the resist patterns, with the formed resist pattern used as mask, the etching mask layer is etched. Thereafter, the resist patterns on the etching mask layer which are not etched are peeled off to form etching mask patterns.

Then, with the etching mask pattern used as a mask, the area from the p-type contact layer 18 to part of p-type clad layer 17 or from the p-type contact layer 18 to p-side light guide layer 15 is etched. Etching can be exemplified by dry-etching utilizing the Cl-based plasma. By this process, a mesa from the p-type contact layer 18 to part of the p-type clad layer 17 or from the p-type contact layer 18 to the p-side light guide layer 15 is formed.

Insulation Film Forming Process S204

The insulation film forming process S204 is a process to form the insulation film 20 so as to cover the etching mask pattern, p-side light guide layer 15 exposed in the mesa forming process S203 and the side of the mesa. With the etching amount of the mesa forming process S203, it might be the case that the exposed layer is not the p-side light guide layer 15 but the p-type clad layer 17.

On the whole surface of the mesa formed in the mesa forming process S203, the insulation film 20 is formed. A process for forming the insulation film 20 can be exemplified by sputtering.

Then, the etching mask pattern of the p-type contact layer 18 is removed. A process for removing the etching mask pattern can be exemplified by immersing the pattern in a buffered fluorinated acid which is an ammonium hydrogen-difluoride solution and carrying out wet-etching. By removing the etching mask pattern, the insulation film 20 laminated on the etching mask pattern is lifted off, too, and the p-type contact layer 18 is exposed.

Positive Electrode Forming Process S205

The positive electrode forming process S205 is a process for forming the positive electrode on the side opposite to the GaN substrate side of the semiconductor laminated body. By forming the positive electrode 19 so as to cover the whole surface of the side with the mesa formed of the semiconductor laminated body 63, the positive electrode 19 comes in contact with the p-type contact layer 18 exposed above the mesa after the etching mask pattern is removed in the mesa forming process S203. A process for forming the positive electrode 19 is exemplified by sputtering or vacuum evaporation.

Substrate Grinding Process S255

The substrate grinding process S255 is a process to reduce thickness of the GaN substrate 12 by grinding in order to reduce electric resistance of the semiconductor laser 101. By chemically and/or physically grinding from the side opposite to the n-type clad layer 27 of the GaN substrate 12 (hereinafter referred to as the "back surface of the GaN substrate 12") such that the electric resistance of the semiconductor laser 101 achieves a predetermined value, the thickness of the GaN substrate 12 is brought to a predetermined value. The grinding method can be exemplified by CMP. When the semiconductor laminated body 63 is laminated by the use of the GaN substrate 12 with reduced thickness, the substrate grinding process S255 may be omitted.

Cleaning Process S207

The cleaning process S207 is a process to clean the side opposite to the semiconductor laminated layer side of the GaN substrate 12 with the cleaning liquid.

Using the acid or alkaline cleaning liquid, the back surface of the GaN substrate 12 is cleaned. A specific example of the cleaning method is shown as follows. First, the back surface of the GaN substrate 12 is treated with fluorinated acid or buffered fluorinated acid in order to remove oxides generated on the back surface of the GaN substrate 12. In order to improve the cleaning effects, the back surface of the GaN substrate 12 may be irradiated with $CF_4$ plasma or chlorine-based plasma after the fluorinated acid treatment. Then, the back surface of the GaN substrate 12 is cleaned preferably with hydrochloric acid used as a cleaning liquid.

Negative Electrode Forming Process S208

The negative electrode forming process S208 is a process for forming the negative electrode which has a metal layer in contact with the side opposite to the semiconductor laminated body side of the GaN substrate 12.

First, on the positive electrode 19 side, a protective layer is formed. The protective layer can be exemplified by a metal film different from the metal of the positive electrode 19 or an insulation film such as $SiO_2$, etc. In addition, on the positive electrode 19 side, wax is applied to affix a substrate of sapphire, etc., and the substrate may be used for the protective layer. The protective layer protects the semiconductor laser from various external forces applied to the semiconductor laser in the subsequent processes. After forming the protective layer, the semiconductor laser is turned over to bring the protective layer into contact with a fixed base to fix the semiconductor laser.

Then, using the evaporation method or sputtering method, to the whole surface on the side opposite to the side of the semiconductor laminated body 63 of the GaN substrate 12, metal which can create an ohmic junction with the n-type GaN, for example, an Al layer is laminated. Furthermore, following the metal layer, an Au film is laminated by the sputtering method. By continuously laminating the metal layer and the Au layer, the negative electrode 11 is formed. After forming the negative electrode 11, the protective layer is removed.

Chip Forming Process S209

The chip forming process S209 is a process for forming semiconductor laser chips by cutting the wafer-form GaN substrate 12 which has undergone the semiconductor laminated body forming process S202 to the negative electrode forming process S208 into desired sizes. First, the GaN substrate 12 is cleaved and cut at intervals of about 100 nm or more to about 500 nm or less in a direction perpendicular to the mesa formed in the mesa forming process S203. The cleaved surface becomes a light-emitting end surface from which lasers are emitted.

Then the GaN substrate 12 is cut parallel to the longitudinal direction of the mesa between the mesa and the mesa so that the cut surface does not come in contact with the mesa. A cutting method can be exemplified by a method to cut by a dicing machine or cleaving method. In the chip forming process S209, a plurality of semiconductor lasers 101 can be obtained from wafer-form GaN substrate 12.

By implementing the semiconductor laminated body forming process 202 to the chip forming process S209 of FIG. 2, a semiconductor laser 101 can be manufactured.

Applying voltage across the positive electrode 19 and the negative electrode 11 of the semiconductor laser 101 injects electrons from the negative electrode 11 and positive holes from the positive electrode 19 into the semiconductor laser 101. The injected electrons move the GaN substrate 12, n-type clad layer 27, and n-side light guide layer 25 successively in that order and reach the active layer 14. On the other hand, the injected positive holes move the p-type contact layer 18, p-type clad layer 17, and p-side light guide layer 15 successively in that order and reach the active layer 14.

The positive holes and electrons which have reached the active layer 14 are recombined with one another and generate light. Of the light generated in the active layer 14, a majority is confined within the interface between the p-side light guide layer 15 and p-type clad layer 17 and the interface between the n-side light guide layer 25 and the n-type clad layer 27, and promotes induced emission.

Because the semiconductor laser 101 has an ohmic junction formed between the GaN substrate 12 and the negative electrode 11, the semiconductor laser 101 provides lower electric resistance than conventional semiconductor lasers and can increase the light-emitting efficiency. In addition, the semiconductor laser manufacturing method of FIG. 2 can form the negative electrode which creates an ohmic junction with the GaN substrate 12 without sintering, a sintering process which used to be required in the past can be eliminated and the productivity of semiconductor lasers can be improved.

Second Preferred Embodiment

A second preferred embodiment of the present invention provides a semiconductor laser which is a Group III nitride based compound expressed by the compositional formula of GaN and which includes a GaN substrate which has an area of reversal of polarity whose dislocation density is higher than that of other areas, a semiconductor laminated body in which a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) are laminated on the GaN substrate in the thickness direction of the GaN substrate, a positive electrode disposed on the side opposite to the GaN substrate side of the semiconductor laminated body, a negative electrode which has a metal layer in contact with the side opposite to the semiconductor laminated body side of the GaN substrate, wherein the area of reversal of polarity of the GaN substrate extends in the direction from the negative electrode side of the GaN substrate to the semiconductor laminated body side, and the metal layer of the negative electrode comes in contact with the area of reversal of polarity at the interface between the GaN substrate and the negative electrode.

Figure 3:
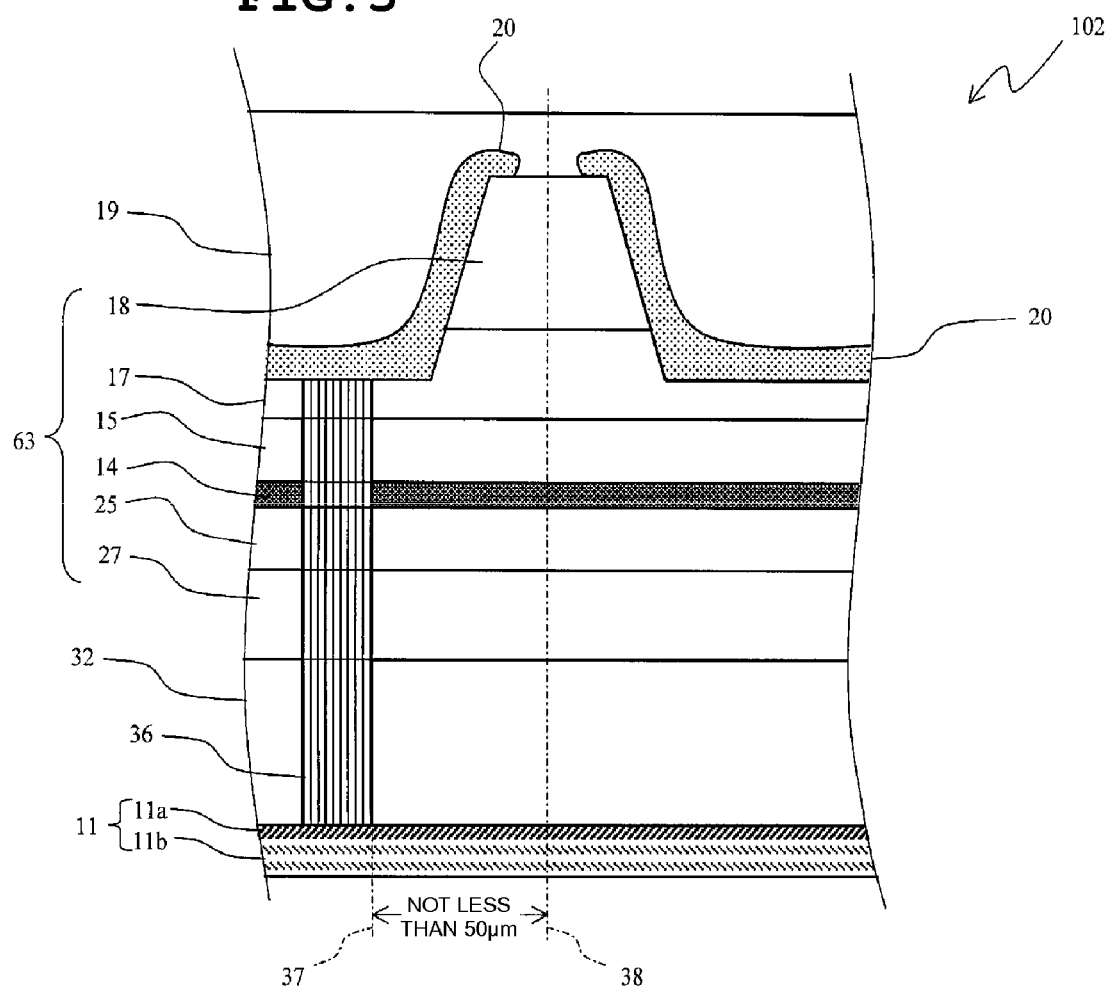
FIG. 3 is a conceptual block diagram of a cross-section of a semiconductor laser according to another preferred embodiment of the present invention.

FIG. 3 is a conceptual diagram of a cross section of the semiconductor laser 102 of the present preferred embodiment. In FIG. 3, like reference characters designate like or corresponding parts and semiconductor layers and have like and similar functions. The difference of semiconductor laser 102 and the semiconductor laser 101 of FIG. 1 is that the semiconductor laser 102 uses GaN substrate 32 in place of GaN substrate 102.

The GaN substrate 32 is bulk-form n-type GaN crystal which has the area of reversal of polarity 36. The area of reversal of polarity 36 is an area with higher crystal dislocation density than in other areas of GaN substrate 32. The area of reversal of polarity 36 provides the electric resistance lower than that of other areas of the GaN substrate 32 and has a property to easily pass the electricity. The area of reversal of polarity 36 penetrates from one side of the GaN substrate 32 to the other side in the vertical direction.

The thickness of the GaN substrate 32 in the vertical direction is exemplified to be about 80 µm or more to about 200 µm or less. The GaN substrate 32 serves as a base to physically support the semiconductor laminated body 63.

The semiconductor laser 102 can be manufactured by a method of manufacturing semiconductor lasers including forming a GaN substrate with an area of reversal of polarity whose dislocation density is higher than that of other areas and which extends from a mask of a substrate forming board in the growing direction of Group III nitride based compounds expressed by the compositional formula of GaN by allowing Group III nitride based compounds expressed by the compositional formula of GaN to grow on one of the surfaces of the substrate forming board with the mask on one surface in the thickness direction, forming a semiconductor laminated body by laminating a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) in the laminating direction of the GaN substrate such that the laminated body comes in contact with the area of reversal of polarity which appears on the side opposite to the substrate forming board side of the GaN substrate, forming a positive electrode on the side opposite to the GaN substrate side of the semiconductor laminated body, forming a GaN substrate bottom surface by removing the substrate forming board until the area of reversal of polarity of the GaN substrate is exposed from the side opposite to the GaN substrate side of the substrate forming board at least in the GaN substrate direction, cleaning the GaN substrate bottom surface formed in the substrate forming board removal process with a cleaning liquid, and forming a negative electrode by laminating metal layers so as to come in contact with the area of reversal of polarity exposed on the GaN substrate bottom after the cleaning process.

In addition, the semiconductor laser 102 can be manufactured by a method of manufacturing semiconductor lasers including forming a GaN substrate with an area of reversal of polarity whose dislocation density is higher than that of other areas and which extends from a mask of a substrate forming board in the growing direction of Group III nitride based compounds expressed by the compositional formula of GaN by allowing Group III nitride based compounds expressed by the compositional formula of GaN to grow on one of the surfaces of the substrate forming board with the mask on one surface in the thickness direction, removing the substrate forming board until the area of reversal of polarity of the GaN substrate is exposed from the side opposite to the GaN substrate side of the substrate forming board at least in the GaN substrate direction, forming a semiconductor laminated body by laminating a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) in the thickness direction of the GaN substrate such that the laminated body comes in contact with the area of reversal of polarity of either one of the surfaces located in the thickness direction of the GaN substrate, forming a positive electrode on the side opposite to the GaN substrate side of the semiconductor laminated body, cleaning the GaN substrate bottom surface opposite to the semiconductor laminated body side of the GaN substrate with a cleaning liquid, and forming a negative electrode by laminating metal layers in so as to come in contact with the area of reversal of polarity exposed on the GaN substrate bottom after the cleaning process.

Figure 4:
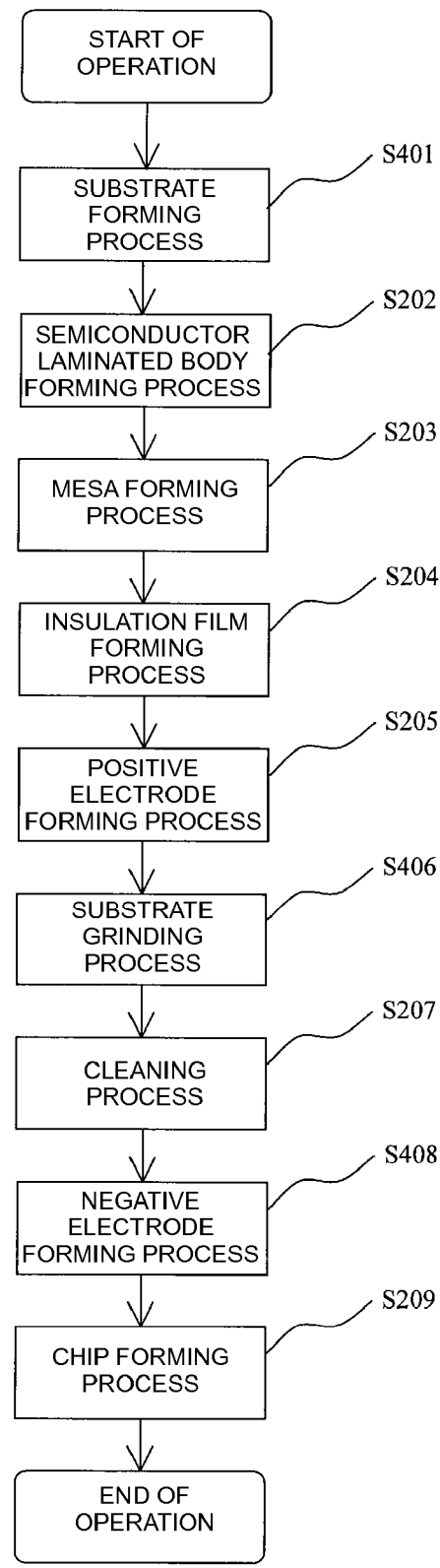
FIG. 4 is a process flow chart of a method of manufacturing semiconductor lasers according to another preferred embodiment of the present invention.
Figure 5A:
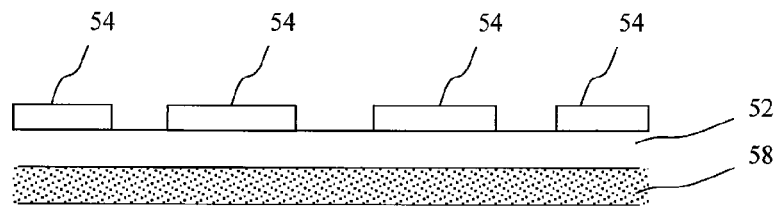
FIGS. 5A to 5E are a conceptual diagram of a substrate forming process in the method of manufacturing semiconductor lasers according to another preferred embodiment of the present invention; wherein the views from step (1) in FIG. 5A through step (5) in FIG. 5E are cross-sectional views when the substrate is cut by the surface perpendicular to the longitudinal direction of a mask; and step (1) in FIG. 5A is a view after a mask is formed on a substrate forming board, step (2) in FIG. 5B is a view indicating that a GaN which configures a GaN substrate is allowed to ELO-grow, step (3) in FIG. 5C is a view that indicates that one GaN block collides against the adjacent GaN block and the area of reversal of polarity begins to be formed, step (4) in FIG. 5D is a view when the grow of the GaN is stopped, and step (5) in FIG. 5E is a view when the surface of the grown GaN compound is ground and flattened
Figure 5B:
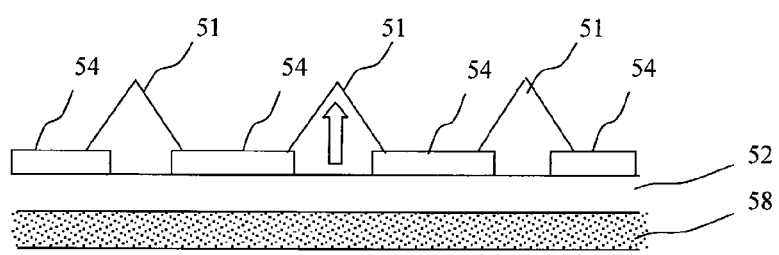
Figure 5C:
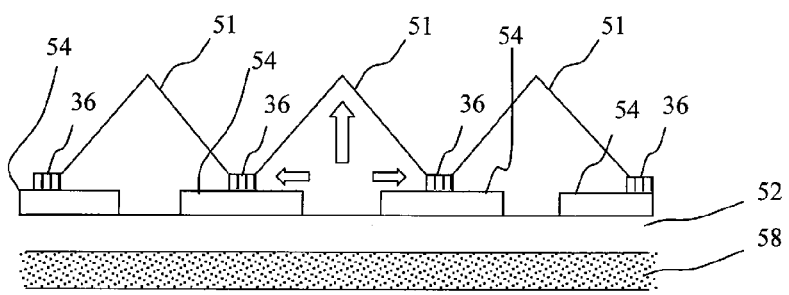
Figure 5D:
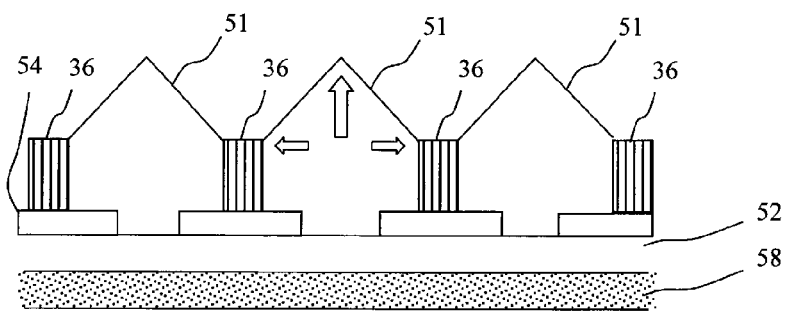
Figure 5E:
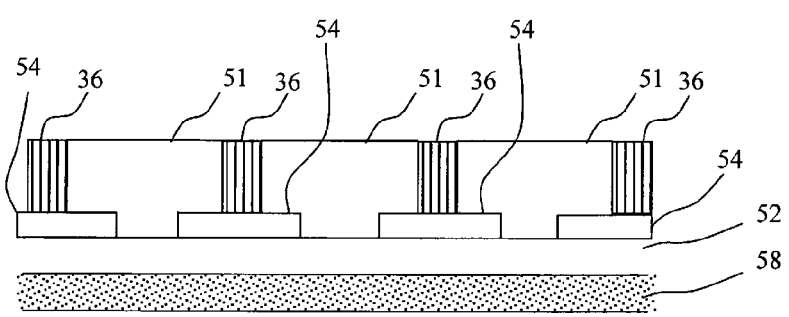

FIG. 4 is a process flow chart of a method of manufacturing semiconductor lasers, which manufactures the semiconductor laser 102. In FIG. 4, the similar reference characters used in FIG. 2 designate the same processes. The difference of the method of manufacturing semiconductor lasers of FIG. 4 from the method of manufacturing semiconductor lasers in FIG. 2 is that the method of manufacturing semiconductor lasers of FIG. 4 has a substrate forming process S401 performed before the semiconductor laminated body forming process S202 and a substrate forming removal process S406 between the positive electrode forming process S205 and the cleaning process S207. Furthermore, the method of manufacturing semiconductor lasers of FIG. 4 has a negative electrode forming process S408 performed in place of the negative electrode forming process S208 of the method of forming semiconductor lasers of FIG. 2.

Of the processes of the method of manufacturing semiconductor lasers of FIG. 4, processes which differ from the method of manufacturing semiconductor lasers of FIG. 2 will be specifically discussed as follows.

Substrate Forming Process S401

The substrate forming process S401 is a process for forming GaN that configures the GaN substrate 32 and the area of reversal of polarity 36. FIG. 5 is a conceptual diagram of the substrate forming process S401. First, on the top surface of a disk-form substrate forming board 58 not less than about 50 µm and not more than about 200 µm thick, a buffer layer 52 having GaN is laminated to be not less than about 50 µm and not more than about 100 µm in thickness, and furthermore, a mask layer to form a mask 54 is laminated to be not less than about 10 nm and not more than about 1000 nm in thickness. For the material of the substrate forming board 58, sapphire, SiC, etc. can be used.

For the material of the buffer layer 52, GaN-based compounds can be applied. The buffer layer 52 may be formed by halide vapor phase epitaxy (HVPE method), molecular beam epitaxy (MBE method), metalorganic chemical vapor deposition (MOCVD method), and other crystal growth methods. The buffer layer 52 may be a single-layer GaN-based compound and may have a plurality of GaN-based compounds laminated. For example, GaN may be laminated after laminating GaN-based compounds.

For the material of the mask layer, for example, $SiO_2$ and SiN may be used. The mask layer can be formed on the surface of the buffer layer 52 by a sputtering method, CVD method, evaporation method using $SiO_2$ and SiN.

Using a photolithography and wet-etching method after forming the mask layer can form a plurality of stripe-form masks 54 from the mask layer. For example, the line width (the dimension that is perpendicular to the longitudinal direction) of the mask 54 is preferably not less than about 10 µm and not more than about 500 µm, and the intervals with the adjacent mask 54 can be exemplified to be designed to be not less than about 1 µm and not more than about 10 µm (FIG. 5 step (1)). FIG. 5 is a cross-sectional view when the layer is cut by a surface perpendicular to the longitudinal direction of the mask 54. In the following discussion, the part of the buffer layer 52 exposed between one mask 54 and the adjacent mask 54 is called the crystal growth part.

Next, by the HVPE method, MBE method, MOCVD method, and other crystal growth method, GaN 51 is allowed to undergo ELO (Epitaxial Lateral Overgrowth: direction-selective growth). ELO growth is a method of forming thin film while the crystal growth directions (vertical direction, horizontal direction, or both vertical and horizontal directions) are being controlled by adjusting the temperature and the pressure inside the chamber in the crystal growth method.

In the present process, the temperature and the pressure inside the chamber are set such that GaN grows in the horizontal direction. First, the GaN crystal appears as a nucleus around the center of the crystal growing part. Then, the GaN crystal grows in the horizontal direction, centering on the nucleus and thin GaN film is formed at the crystal growing part. Furthermore, in the vicinity of the center of the GaN film, a GaN nucleus appears and in the same manner, the GaN crystal grows in the horizontal direction. In this way, repeating the ELO growth increases the thickness of GaN 51 (FIG. 5 step (2)).

As GaN continues ELO growth, the thickness of GaN 51 exceeds the thickness of the mask 54. When the thickness of the GaN 51 exceeds the thickness of the mask 54, the GaN crystal grows as if it covers the mask 54 and collides with GaN 51 which makes ELO grow from the adjacent crystal growing part on the mask 54. Because the colliding GaN crystals differ in the crystal direction from each other, dislocation occurs at the colliding part. Furthermore, by allowing GaN to make ELO growth, the thickness of GaN 51 increases and at the same time, the dislocation grows on the mask 54 in the vertical direction and the area of reversal of polarity 36 is formed (FIG. 5 step (3)). After laminating GaN 51 in a predetermined thickness, ELO growth is stopped (FIG. 5 step (4)) and the surface is flattened by grinding the side opposite to the substrate forming board 58 of GaN 51 (FIG. 5 step (5)).

After the substrate forming process S401, the semiconductor laminated body forming process S202 is carried out and a semiconductor laminated body 63 is formed on the flattened surface. On the surface flattened as is the case of FIG. 5 step (5), the GaN 51 and the area of reversal of polarity 36 are exposed, and of the crystal layers which are laminated on the flattened surface, crystals at the portion in contact with the area of reversal of polarity 36 have the dislocation density increased. Consequently, the area of reversal of polarity 36 elongates upwards as semiconductor layers are laminated.

Substrate Forming Board Removal Process S406

The substrate forming board removal process S406 is a process to form the GaN substrate 32 by removing the substrate forming board at least until the area of reversal of polarity of the GaN substrate is exposed from the side opposite to the GaN substrate side of the substrate forming board to the GaN substrate side.

Figure 6A:
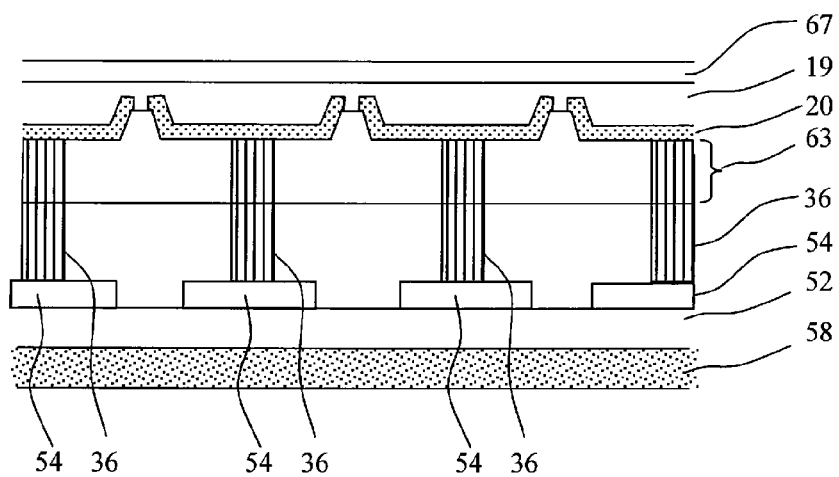
FIGS. 6A and 6B are a conceptual diagram of a substrate forming board removal process in the method of manufacturing semiconductor lasers according to another preferred embodiment of the present invention; wherein steps (1) in FIG. 6A and (2) in FIG. 6B are cross sectional views when the substrate is cut by the surface perpendicular to the longitudinal direction of the mask; and step (1) in FIG. 6A is a view in which a protection layer is formed on a positive electrode, and step (2) in FIG. 6B is a view in which the GaN substrate of a predetermined thickness is formed by grinding from a substrate forming board side.
Figure 6B:
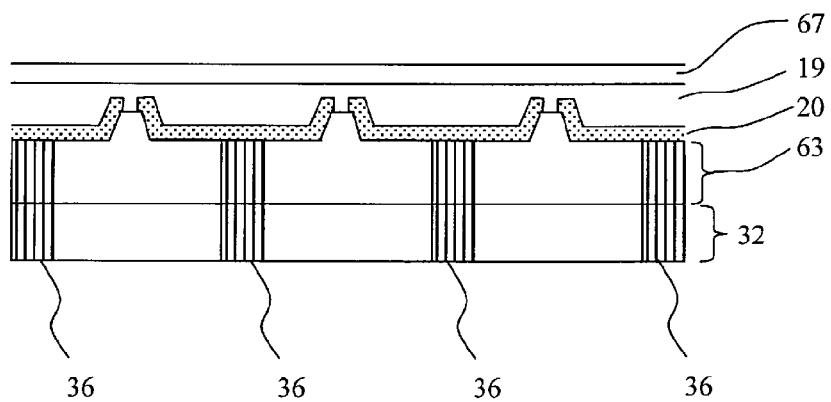

In this process, first, as described in the negative electrode forming process S208 of FIG. 2, the protective layer 67 is formed on the positive electrode 19 side (FIG. 6 step (1)). Then, the semiconductor laser is turned over to bring the protective layer 67 in contact with a fixed base to fix the semiconductor laser. After the semiconductor laser is fixed to the fixed base, a predetermined amount is removed from the substrate forming board 58 side. Specifically, until the area of reversal of polarity 36 is exposed, the substrate forming board 58, buffer layer 52, mask 54, and part of GaN 51 are removed (FIG. 6 step (2)). The removal method can be exemplified by physically and/or chemically grinding methods, for example, CMP.

Figure 8:
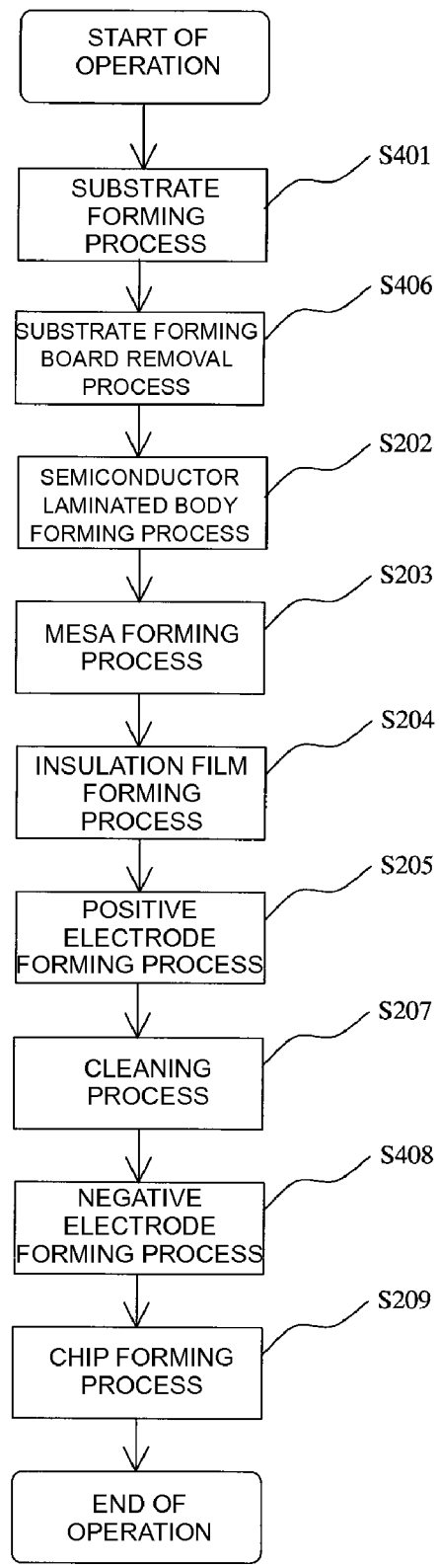
FIG. 8 is a process flow chart of a method of manufacturing semiconductor lasers according to another preferred embodiment of the present invention.

This process may be carried out between the substrate forming process S401 and the semiconductor laminated body forming process S202 as is the case of the process flow chart of the method of manufacturing semiconductor lasers shown in FIG. 8. In FIG. 8, like reference characters used in FIG. 4 designate the like and corresponding processes. In the case of the method of manufacturing semiconductor lasers shown in FIG. 8, at the time when this process is finished, the GaN substrate 32 having a predetermined thickness is formed. Because on both surfaces in the thickness direction of the GaN substrate 32, the area of reversal of polarity 36 is exposed, in the semiconductor laminated body forming process S202 of the subsequent process, the semiconductor laminated body 63 may be formed on any of the surfaces of GaN substrate 32.

Negative Electrode Forming Process S408

The negative electrode forming process S408 is a process to form the negative electrode 11 by laminating metal layers so as to come in contact with the area of reversal of polarity 36 which is exposed on the bottom surface of the GaN substrate.

Because the protective layer is already formed on the positive electrode 19 side in the substrate forming board removal process S406, the negative electrode forming process S408 has the step to form the protective layer on the positive electrode 19 side from the negative electrode forming process S208 of FIG. 2.

In the mesa forming process S203 of FIG. 4, the mesa is formed in such a manner that the direction of the mesa is substantially parallel to the direction of the mask 54 and at the same time the intervals of the mesa and those of the mask 54 are substantially equal. Furthermore, in the chip forming process S209 of FIG. 4, when the substrate is cut in the longitudinal direction of the mesa, the intervals of a plurality of mesas are cut substantially parallel to the longitudinal direction of the mesa with care to prevent the cutting surface from coming in contact with the mesa and the area of reversal of polarity 36.

Figure 7:
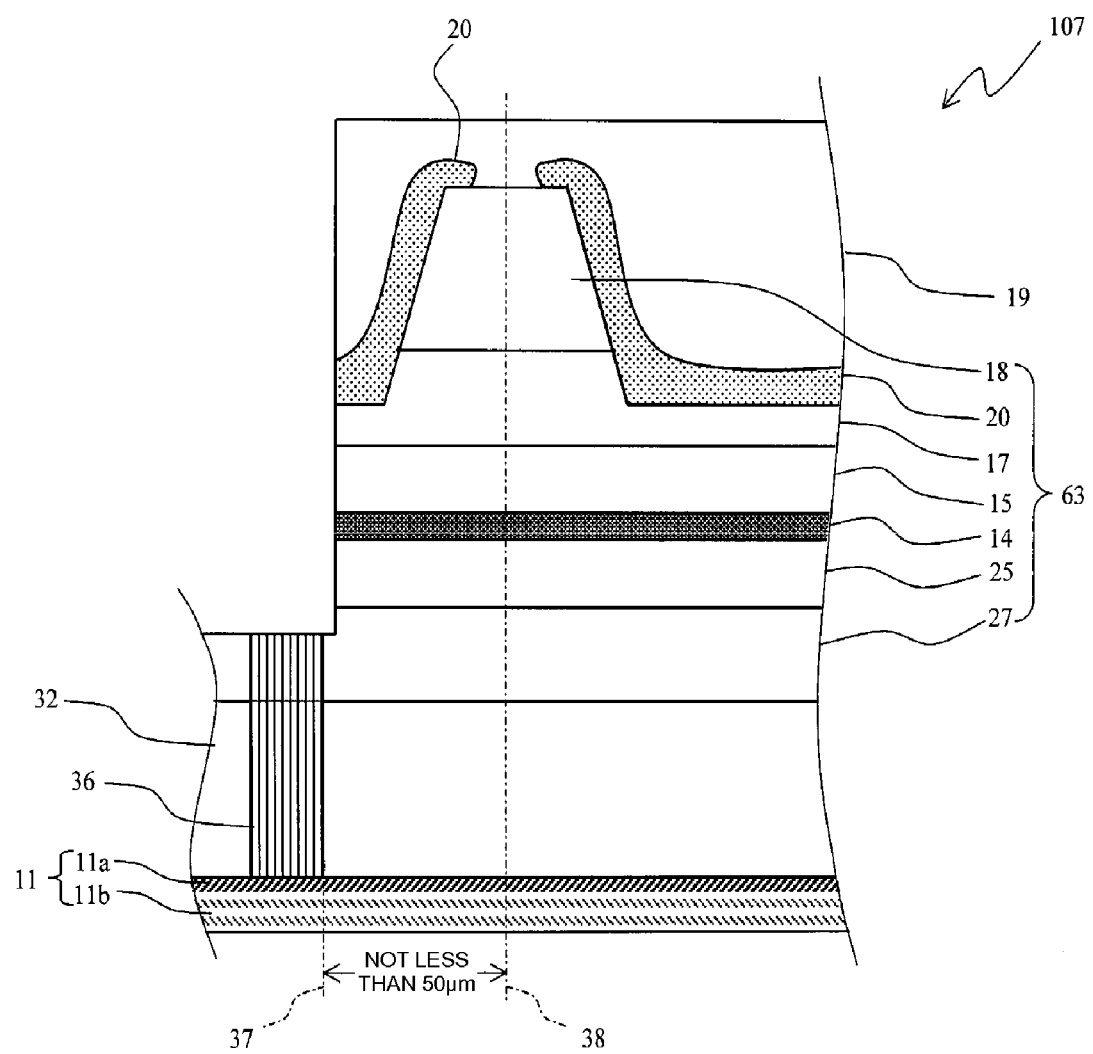
FIG. 7 is a conceptual block diagram of a cross-section of a semiconductor laser according to another preferred embodiment of the present invention, wherein because the distance between a mesa side of the area of reversal of polarity and the center of the mesa in the horizontal direction is 50 µm or less, the portion from the positive electrode at the upper part of the area of reversal of polarity to part of the n-type clad layer is removed.

By carrying out from the substrate forming process S401 to the chip forming process S209 of FIG. 4, the semiconductor laser 102 can be manufactured. The semiconductor laser 102 is designed so that the distance between the mesa side 37 of the area of reversal of polarity 36 and the center 38 of the mesa is not less than about 50 μm in the horizontal direction. In the event that the distance between the mesa side 37 of the area of reversal of polarity 36 and the center 38 of the mesa is unable to achieve about 50 μm or more in the horizontal direction, for example in producing the semiconductor laser with high density, it is necessary to prevent the area of reversal of polarity 36 from coming in contact with the active layer 14. For example, as is the case of the semiconductor laser 107 of FIG. 7, after forming the positive electrode 19, the area from the positive electrode 19 at the upper part of the area of reversal of polarity 36 to part of the n-type clad layer 27 is removed by etching. In FIG. 7, like reference characters used in FIG. 3 designate like components and semiconductor layers and have the like functions.

By applying voltage across the positive electrode 19 and the negative electrode 11, the semiconductor lasers 102 and 107 can oscillate lasers in the same manner as the semiconductor laser 101 of FIG. 1.

Because the GaN substrate 32 and negative electrode 11 form an ohmic junction, it is possible to obtain the same effects as those explained for the semiconductor laser 101 of FIG. 1 with semiconductor lasers 102 and 107. In addition, because the negative electrode that creates an ohmic junction with the GaN substrate 32 without sintering, the effects obtained in the method of manufacturing semiconductor lasers of FIG. 2 can be obtained with the method of manufacturing semiconductor lasers of FIG. 4.

Furthermore, because semiconductor lasers 102 and 107 have the area of reversal of polarity 36 with small electric resistance in the GaN substrate 32, electrons injected from the negative electrode 11 can conduct the area of reversal of polarity 36.

Consequently, the area of reversal of polarity 36 can lower the electric resistance of semiconductor lasers 102 and 107 and increase the light-emitting efficiency. In addition, in the substrate forming process S401 of the method of manufacturing semiconductor lasers of FIG. 4, the area of reversal of polarity 36 can be positively formed at the desired position of the GaN substrate 32 by utilizing the substrate forming board 58 with the mask 54 and semiconductor lasers 102 and 107 with high light-emitting efficiency can be easily manufactured.

The configuration of semiconductor lasers according to preferred embodiments of the present invention can be utilized as a light-receiving element. In addition, it can be utilized for electronic devices such as transistors, diodes, and compound high-frequency electronic devices such as those represented by HEMT. In addition, the method of manufacturing semiconductor lasers according to preferred embodiments of the present invention can be utilized when the light receiving elements, electronic devices, and compound high-frequency electronic devices are manufactured.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A semiconductor laser, comprising:
   a GaN substrate of Group III nitride-based compounds expressed by a compositional formula of GaN;
   a semiconductor laminated body on which a plurality of layers of Group III nitride based compounds expressed by a compositional formula of $Al_xGa_yIn_{1-x-y}N$ ($0 \leq x \leq 1$, $0 \leq y \leq 1$, $0 \leq x+y \leq 1$) are laminated in a thickness direction of the GaN substrate;
   a positive electrode disposed at a top side of the semiconductor laminated body, the top side of the semiconductor laminated body being opposite to a bottom side of the semiconductor laminated body facing the GaN substrate; and
   a negative electrode including an Al layer in contact with a bottom side of the GaN substrate, the bottom side of the GaN substrate being opposite to a top side of the GaN substrate facing the semiconductor laminated body.

2. The semiconductor laser according to claim 1, wherein the Al layer of the negative electrode in contact with the GaN substrate contains substantially no Ti.

3. A semiconductor laser, comprising:
   a GaN substrate of a Group III nitride based compound expressed by the compositional formula of GaN which has an area of reversal of polarity whose dislocation density is higher than that of other areas;
   a semiconductor laminated body in which a plurality of layers of Group III nitride based compounds expressed by the compositional formula of $Al_xGa_yIn_{1-x-y}N$ ($0 \leq x \leq 1$, $0 \leq y \leq 1$, $0 \leq x+y \leq 1$) are laminated on the GaN substrate in a thickness direction of the GaN substrate;

a positive electrode disposed at a top side of the semiconductor laminated body, the top side of the semiconductor laminated body being opposite to a bottom side of the semiconductor facing the GaN substrate; and a negative electrode including a metal layer in contact with a bottom side of the GaN substrate, the bottom side of the GaN substrate being opposite to a top side of the GaN substrate facing the semiconductor laminated body; wherein the area of reversal of polarity of the GaN substrate elongates in a direction extending from the bottom side of the GaN substrate to the top side of the GaN substrate, and the metal layer of the negative electrode contacts with the area of reversal of polarity at the interface between the GaN substrate and the negative electrode.

4. The semiconductor laser according to claim 3, wherein the metal layer of the negative electrode is made of Al.

5. The semiconductor laser according to claim 4, wherein the Al metal layer of the negative electrode in contact with the GaN substrate contains substantially no Ti.

6. The semiconductor laser according to claim 4, wherein a distance between the nearest side of the area of reversal of polarity and a center of a mesa portion of the semiconductor laminated body is not less than about 50 mm.

7. The semiconductor laser according to claim 4, wherein the area of reversal of polarity is not in contact with an active layer of the semiconductor laminated body.

8. The semiconductor laser according to claim 4, wherein a portion of the semiconductor laser from the positive electrode at the upper portion of the area of reversal of polarity to a portion of an n-type clad layer in the semiconductor laminated body is removed.

9. The semiconductor laser according to claim 3, wherein the distance between the nearest side of the area of reversal of polarity and a center of a mesa portion of the semiconductor laminated body is not less than about 50 mm.

10. The semiconductor laser according to claim 3, wherein the area of reversal of polarity is not in contact with an active layer of the semiconductor laminated body.

11. The semiconductor laser according the claim 3, wherein a portion of the semiconductor laser from the positive electrode at the upper portion of the area of reversal of polarity to a portion of an n-type clad layer in the semiconductor laminated body is removed.

* * * * *